(12) United States Patent
Hwang et al.

(10) Patent No.: US 11,999,027 B2
(45) Date of Patent: Jun. 4, 2024

(54) METHOD FOR POLISHING SEMICONDUCTOR SUBSTRATE (71) Applicant: TAIWAN SEMICONDUCTOR MANUFACTURING COMPANY LTD., Hsinchu (TW)

(72) Inventors: James Jeng-Jyi Hwang, Hsin-Chu County (TW); He Hui Peng, Changhua County (TW); Jiann Lih Wu, Hsin-Chu (TW); Chi-Ming Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/818,135

(22) Filed: Aug. 8, 2022

(65) Prior Publication Data
US 2022/0384198 A1 Dec. 1, 2022

Related U.S. Application Data (62) Division of application No. 16/837,975, filed on Apr. 1, 2020, now Pat. No. 11,772,227.

(60) Provisional application No. 62/883,746, filed on Aug. 7, 2019.

(51) Int. Cl.
| | | |
|---|---|---|
| H01L 21/304 | (2006.01) | |
| B24B 1/00 | (2006.01) | |
| B24B 37/04 | (2012.01) | |
| B24B 37/20 | (2012.01) | |
| B24B 53/017 | (2012.01) | |
| B24B 57/02 | (2006.01) | |
| H01L 21/321 | (2006.01) | |
| H01L 21/67 | (2006.01) | |

(52) U.S. Cl.
CPC .............. *B24B 37/042* (2013.01); *B24B 1/00* (2013.01); *B24B 37/20* (2013.01); *B24B 53/017* (2013.01); *B24B 57/02* (2013.01); *H01L 21/304* (2013.01); *H01L 21/3212* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 6,315,635 | B1 * | 11/2001 | Lin | ........................ B24B 57/02 451/7 |
| 9,493,677 | B2 * | 11/2016 | Lim | ...................... B24B 37/044 |
| 10,875,148 | B2 * | 12/2020 | Peng | ................... H01L 21/7684 |
| 2020/0070301 | A1 * | 3/2020 | Cui | ........................ B24B 37/015 |
| 2021/0046603 | A1 * | 2/2021 | Wu | ........................ B24B 37/015 |

* cited by examiner

*Primary Examiner* — Long Pham
(74) *Attorney, Agent, or Firm* — WPAT LAW; Anthony King (57) ABSTRACT

A method for polishing a semiconductor substrate includes the following operations. A semiconductor substrate is received. An abrasive slurry having a first temperature is dispensed to a polishing surface of a polishing pad. The semiconductor substrate is polished. The abrasive slurry have a second temperature is dispensed to the polishing surface of the polishing pad during the polishing of the semiconductor substrate. The second temperature is different from the first temperature.

20 Claims, 11 Drawing Sheets

FIG. 11

METHOD FOR POLISHING SEMICONDUCTOR SUBSTRATE

PRIORITY DATA

This patent is a divisional application of U.S. patent application Ser. No. 16/837,975 filed on Apr. 1, 2020, entitled of "DEVICE AND METHODS FOR CHEMICAL MECHANICAL POLISHING", which claims the benefit of U.S. Provisional Patent Application Ser. No. 62/883,746 filed Aug. 7, 2019, the entire disclosure of which is hereby incorporated by reference.

BACKGROUND

Chemical mechanical polishing (CMP) is widely used in the fabrication of integrated circuits. As an integrated circuit is built layer by layer on a surface of a semiconductor wafer, CMP is used to planarize the topmost layer or layers to provide a level surface for subsequent fabrication operations. CMP is carried out by placing the semiconductor wafer in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical actions.

CMP can be used at a number of time points during the fabrication of an integrated circuit. For example, CMP may be used to planarize the inter-level dielectric layers that separate the various circuit layers in an integrated circuit. CMP is also commonly used in the formation of the conductive lines of interconnect components in an integrated circuit. By abrasively polishing the surface of the semiconductor wafer, excess material and surface roughness in layers can be removed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

CMP is an appropriate and widely-used process to remove excess material and to achieve planarization of a substrate. However, CMP suffers from difficulty of its process control. In particular, both the chemical effect and mechanical effect may result in the temperature of the wafer being increased over time. For example, the chemical reaction may result in heat being released, and the mechanical effect also generates frictional heat. Due to the chemical effect and the mechanical effect, the temperature of the polishing pad and the wafer may increase and vary during the CMP. It is known that a removal rate of the CMP operation is correlated to the CMP operation temperature. In order to obtain a desired CMP result, it is important to precisely control the operation temperature over time. However, due to the variation of temperature mentioned above, it is found that the CMP operation temperature is not easily controlled. The operation temperature control issue induces the performance variation (i.e., dishing or erosion) that leads to manufacturing difficulties.

In some comparative approaches, cooling water may be provided in a polish platen for platen temperature control.

However, the polishing pad is formed of a heat-insulating material that impedes the transfer of heat and that is not able to control wafer polish temperature. In other comparative approaches, a cooling slider may be provided on the polishing pad to control the pad temperature, but such comparative approaches suffer from scratch side effect.

The present disclosure therefore provides an apparatus for CMP having a slurry temperature control device for a slurry dispenser. In some embodiments, the slurry temperature control device includes a thermo-electric (TE) chip which is capable of providing precise and immediate cooling or heating function depending on the supplied voltage output. The abrasive slurry is essential to the CMP operation and is disposed between a polishing surface of the polishing pad and a wafer surface. The cooled or heated abrasive slurry can directly participate in wafer polishing. Therefore the slurry temperature control device is provided for instant abrasive slurry cooling/heating control, and thus polishing temperature control is improved.

Figure 1:
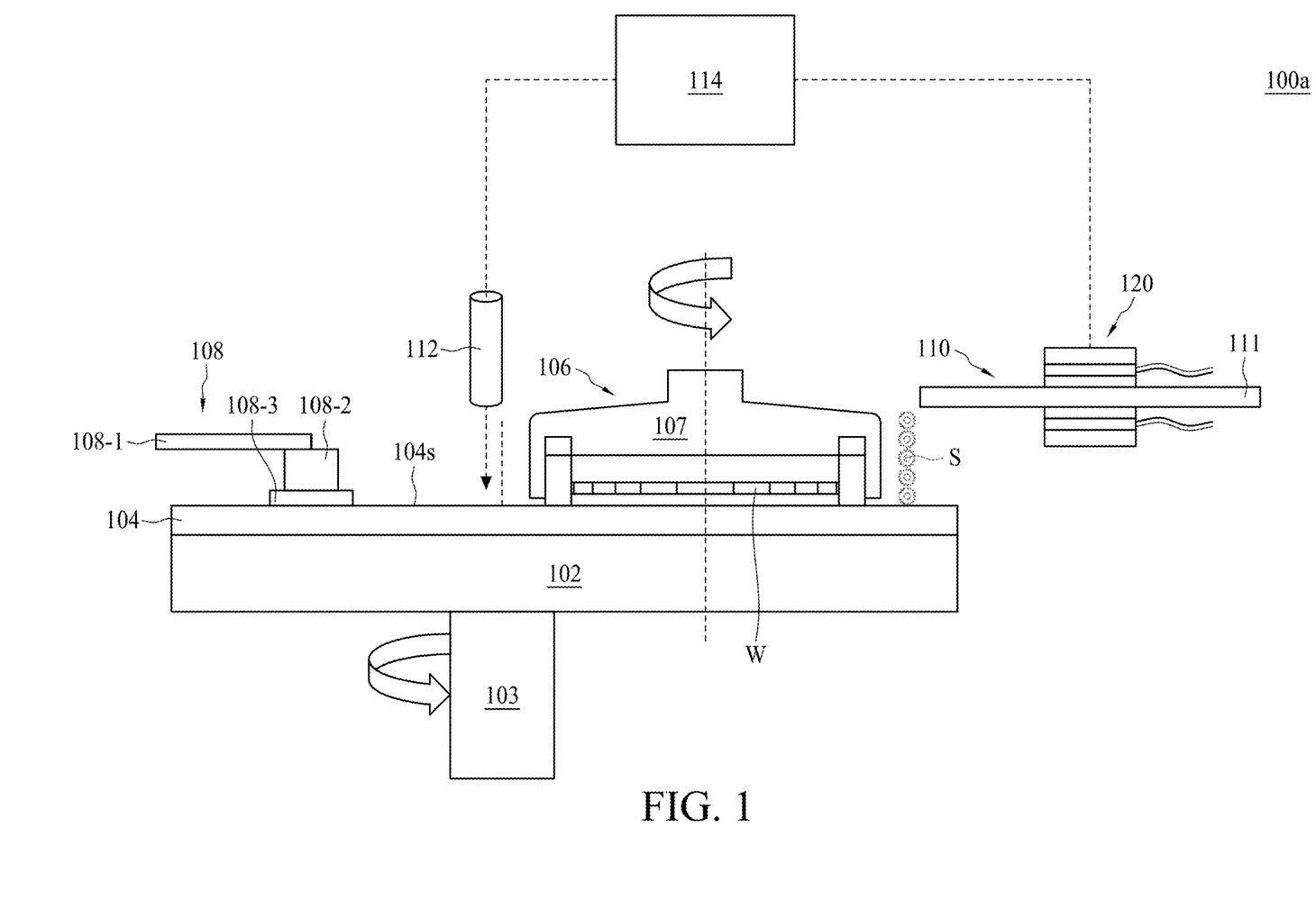
FIG. 1 is a schematic drawing of a device for CMP according to aspects of one or more embodiments of the present disclosure.
Figure 2:
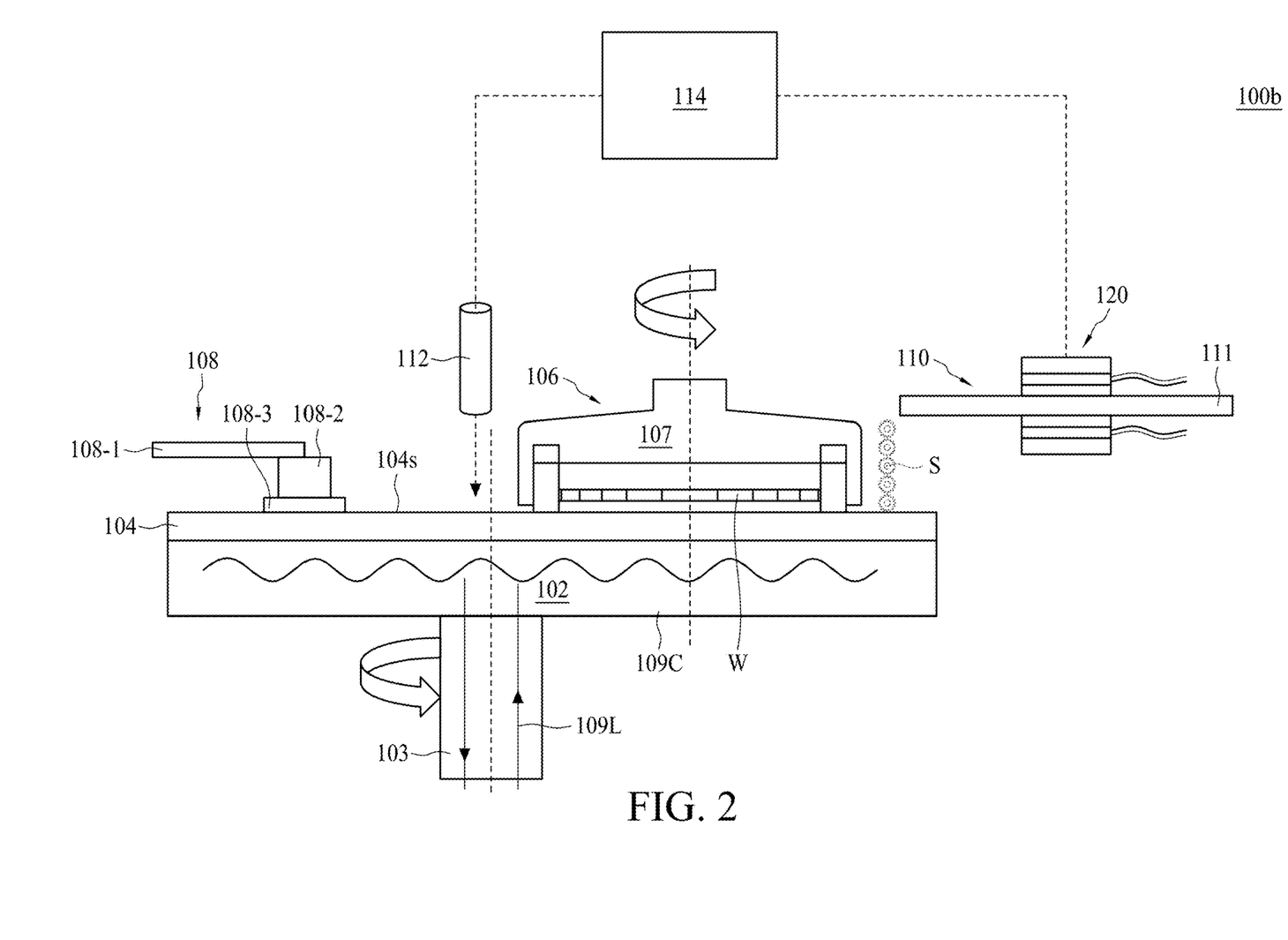
FIG. 2 is a schematic drawing of a device for CMP according to aspects of one or more embodiments of the present disclosure.

FIGS. 1 and 2 are schematic drawings illustrating an apparatus for CMP 100a and 100b according to aspects of one or more embodiments of the present disclosure. It should be understood that same elements in FIGS. 1 and 2 are depicted by same numerals, and repetitive details may be omitted in the interest of brevity. The device for CMP 100a and 100b respectively include a platen 102, a polishing pad 104 provided on top of the platen 102, a wafer carrier (sometimes referred to as a polishing head) 106 configured to support a semiconductor wafer W, a dresser 108 configured to recondition the polishing pad 104, and a slurry dispenser 110 configured to dispense or deliver an abrasive slurry S to the polishing pad 104 to facilitate removal of materials from the semiconductor wafer W. The device for CMP 100a and 100b further include a temperature sensor 112, a control module 114 and a slurry temperature control device 120.

As shown in FIGS. 1 and 2, the platen 102 is configured to rotate in one or more directions. In some embodiments, the platen 102 is configured to be held stationary. In some embodiments, the platen 102 is configured to have a constant rotational speed. In alternative embodiments, the platen 102 is configured to have a variable rotational speed. The platen 102 can be rotated by a motor (not shown). In some embodiments, the motor can be an alternating current (AC) motor, a direct current (DC) motor, a universal motor, or another suitable motor. The platen 102 is configured to accommodate and support the polishing pad 104, as shown in FIGS. 1 and 2. In some embodiments, the platen 102 can be rotated by a rotating shaft 103, which can have a variable rotational speed. The rotating shaft 103 can be rotated by a motor (not shown). In some embodiments, the motor can be an AC motor, a DC motor, a universal motor, or another suitable motor.

The polishing pad 104 is disposed on the platen 102 such that the polishing pad 104 is rotated in a same direction and at a same speed as the platen 102. The polishing pad 104 includes a polishing surface 104s, such as a textured surface, which is configured to remove materials from the semiconductor wafer W during a polishing operation.

The wafer carrier 106 is configured to support and retain the semiconductor wafer W proximate to the polishing surface 104s of the polishing pad 104 during the polishing operation. In some embodiments, the wafer carrier 106 includes a retaining ring to secure the semiconductor wafer W. In some embodiments, the wafer carrier 106 includes a vacuum to secure the semiconductor wafer W. The wafer carrier 106 is configured to rotate in a direction that is the same as or different from a direction of rotation of the platen 102. In some embodiments, a spin shaft 107 rotates the wafer carrier 106 in a direction opposite to the direction of the rotation of the platen 102. In some embodiments, the spin shaft 107 is configured to have a constant rotational speed. In alternative embodiments, the spin shaft 107 is configured to have a variable rotational speed. The spin shaft 107 can be rotated by a motor (not shown). In some embodiments, the motor can be an AC motor, a DC motor, a universal motor, or another suitable motor.

The wafer carrier 106 can be moved in a direction perpendicular to the polishing surface 104s of the polishing pad 104. By moving the wafer carrier 106 in the direction perpendicular to the polishing surface 104s, a pressure exerted on the semiconductor wafer W by the polishing pad 104 is adjustable. In some embodiments, the device for CMP 100a and 100b can include pressure sensors (not shown) to monitor the pressure exerted on the semiconductor wafer W. In some embodiments, the device for CMP 100a and 100b can include a pressure control system (not shown) to control force exerted on the semiconductor wafer W at various locations of the semiconductor wafer W. In some embodiments, the pressure control system can include nozzles configured to emit pressurized gas, translatable pins or other suitable force-exerting elements.

The dresser 108 is configured to recondition the polishing pad 104. In order to maintain the polishing rate, the polishing pad 104 needs to be conditioned to maintain the surface roughness. In some embodiments, a dressing operation (or a conditioning operation) is performed on the polishing pad 104. As shown in FIGS. 1 and 2, the dresser 108 can include a dresser arm 108-1, a dresser head 108-2, and a conditioning disc 108-3, in accordance with some embodiments. In some embodiments, the conditioning disc 108-3 may be a diamond disc with diamonds embedded in a metallic layer secured to a support plate of the conditioning disc 108-3. The metallic layer includes, for example, a Ni layer and/or a Cr layer. The conditioning disc 108-3 is used to scratch and refresh the polishing surface 104s of the polishing pad 104, when the polishing pad 104 has accumulated an excess of polishing debris. Due to the dressing operation performed by the dresser 108, the polishing surface 104s of the polishing pad 104 can be refreshed and the CMP rate can be maintained.

The slurry dispenser 110 is configured to dispense the abrasive slurry S onto the polishing surface 104s of the polishing pad 104. The slurry dispenser 110 includes at least one nozzle (not shown) configured to dispense the abrasive slurry S. In some embodiments, the device for CMP 100a and 100b can include a slurry mix system (not shown) configured to mix various fluid compositions prior to the dispensing of the mixture onto the polishing surface 104s of the polishing pad 104. In some embodiments, the slurry dispenser 110 includes a conduit 111 coupled to the slurry mix system and the nozzle and configured to transport the abrasive slurry S.

In some embodiments, the temperature sensor 112 is configured to detect a temperature of the polishing surface 104s of the polishing pad 104, and to provide a signal corresponding to the temperature of the polishing surface 104s to the control module 114. In some embodiments, the temperature sensor 112 detects a temperature of the abrasive slurry S over the polishing pad 104, and provides a signal corresponding to the temperature of the abrasive slurry S to the control module 114. It should be understood that the abrasive slurry S is dispensed directly over the polishing pad 104; therefore, the temperature of the abrasive slurry S may dominate the temperature of the polishing surface 104s of the polishing pad 104. Therefore, in some embodiments, the detection, by the temperature sensor 112, of the temperature of the abrasive slurry S over the polishing pad 104 can be referred to as detecting the temperature of the polishing surface 104s of the polishing pad 104. In some embodiments, the temperature sensor 112 can include an infra-red (IR) sensor, but the disclosure is not limited thereto.

As shown in FIGS. 1 and 2, the slurry temperature control device 120 is coupled to the control module 114 and configured to control a temperature of the abrasive slurry S. Further, the slurry temperature control device 120 is coupled to the slurry dispenser 120 and configured to control a temperature of the abrasive slurry S. In some embodiments, the slurry temperature control device 120 is coupled to the conduit 111 of the slurry dispenser 110.

Figure 3:
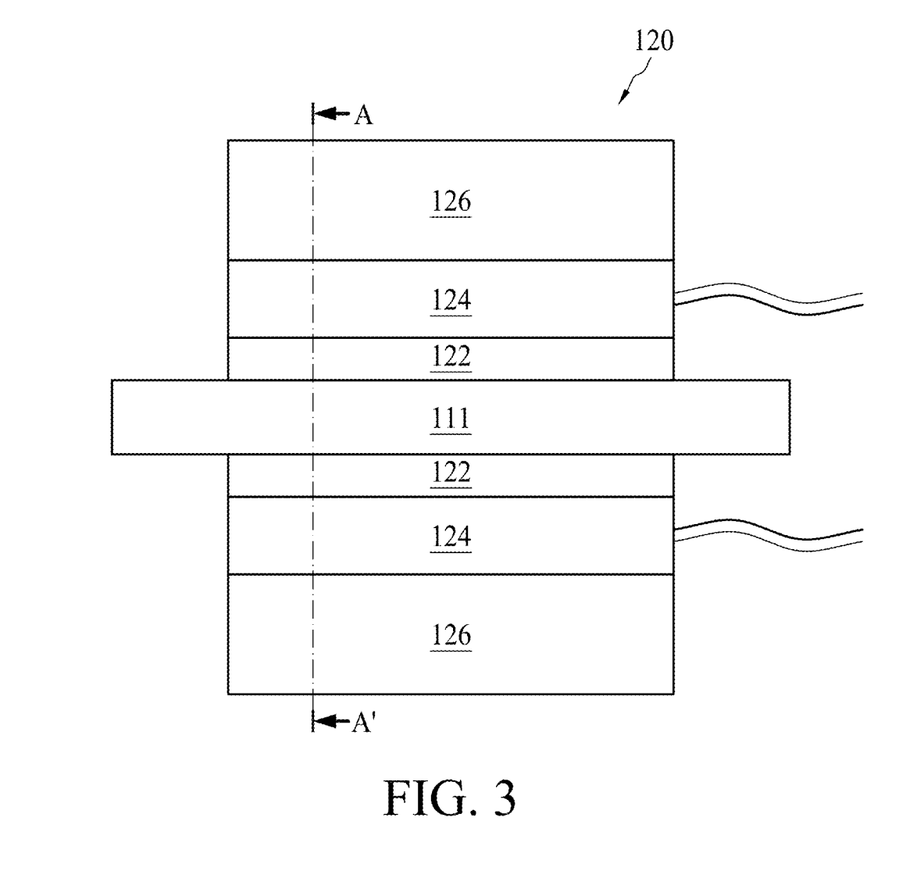
FIG. 3 is a schematic drawing illustrating a side view of a slurry temperature control device according to aspects of one or more embodiments of the present disclosure.
Figure 4:
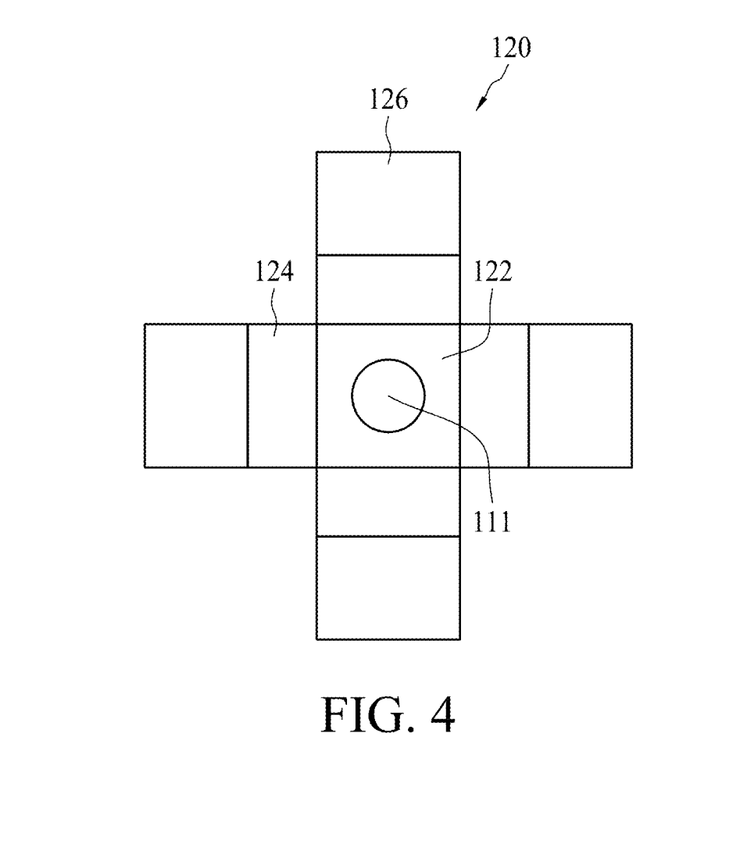
FIG. 4 is a cross-sectional view taken along a line A-A' of FIG. 3.

Please refer to FIGS. 3 and 4, wherein FIG. 3 is a schematic drawing illustrating a side view of the slurry temperature control device 120, and FIG. 4 is a cross-sectional view taken along a line A-A' of FIG. 3. The slurry temperature control device 120 includes a heat-transferring portion 122, a thermo-electric (TE) chip 124 and a heat exchanger 126. As shown in FIGS. 3 and 4, the TE chip 124 is disposed between the heat-transferring portion 122 and the heat exchanger 126.

The heat transferring portion 122 surrounds a portion of the slurry dispenser 110. For example, the heat-transferring portion 122 surrounds a portion of the conduit 111 of the slurry dispenser 110. The heat transferring portion 122 can include heat conductive material such that heat can be easily transferred between the conduit 111 and the TE chip 124. The heat conductive material can include, for example but not limited thereto, metals such as copper, aluminum, or the like; and non-metals such as graphene.

Figure 5:
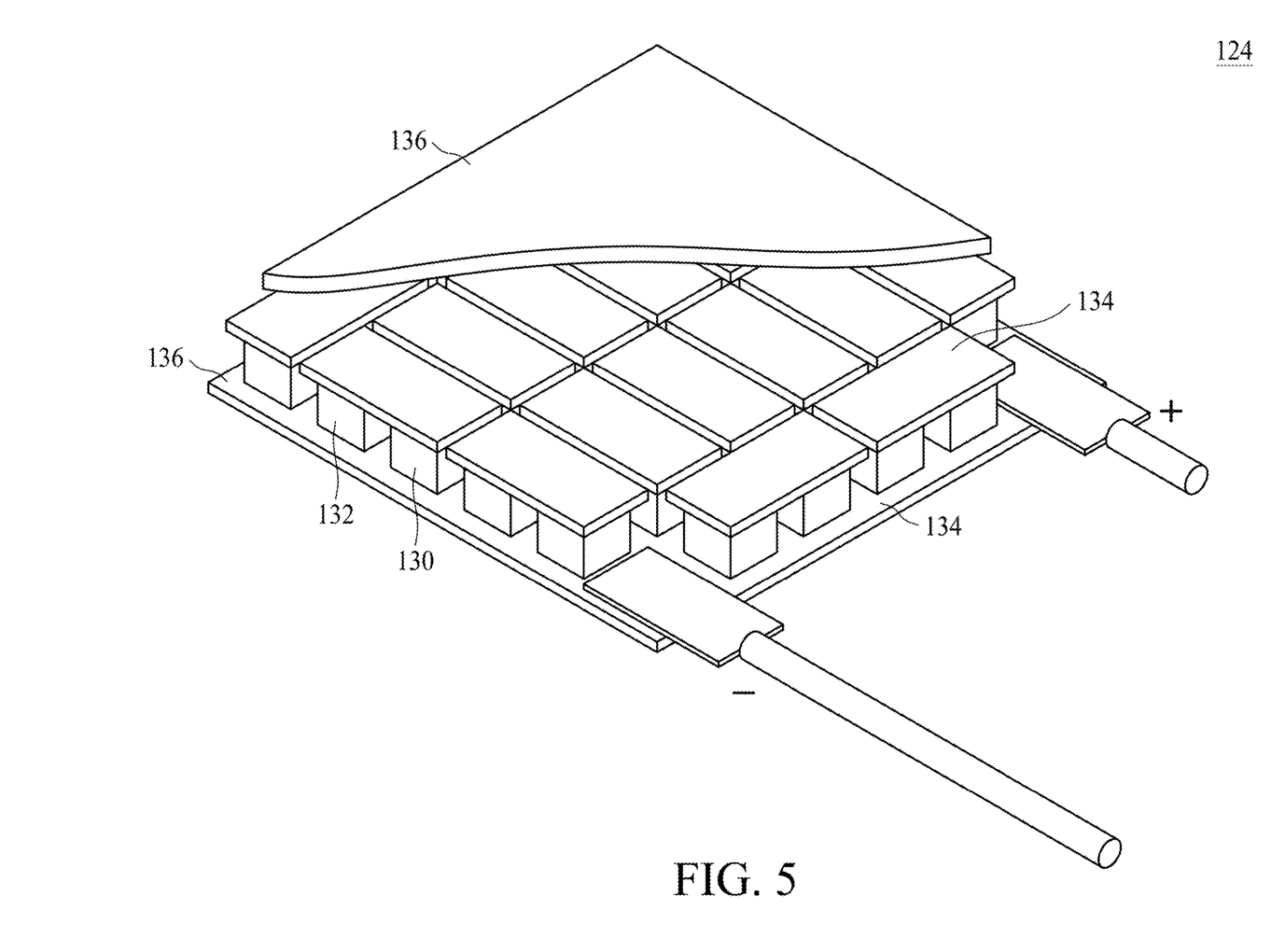
FIG. 5 is a schematic drawing illustrating a TE chip according to aspects of one or more embodiments of the present disclosure.

Referring to FIG. 5, the TE chip 124 can be attached to the heat-transferring portion 122 and configured to control the temperature of the abrasive slurry S. In some embodiments, the TE chip 124 controls the temperature of the abrasive slurry S and limits the temperature to a range between approximately 10° C. and approximately 60° C. It is known that the temperature of the abrasive slurry S is an important factor that strongly affects the apparent viscosity and yield stress of the abrasive slurry S and the removal rate. The temperature of the abrasive slurry also strongly affects the CMP operation temperature, which strongly affects the CMP result. In some comparative approaches, when the temperature of the abrasive slurry S is less than approximately 10° C., the removal rate of the CMP is reduced, and thus process control is adversely impacted. In some comparative approaches, when the temperature of the abrasive slurry S is greater than approximately 60° C., chemical reaction may be accelerated, or some side effects may be generated. For example, it is found that increase in slurry temperature results in an increase in amounts of metal dishing and dielectric erosion. The dishing and erosion in the interconnect features initially increased with increase in temperature and then decreased at elevated temperatures.

In some embodiments, the principle of the Peltier Effect may be applied to model behavior of a TE chip 124. According to the Peltier Effect, when DC power is applied to two different materials, heat may be absorbed at the junction of the materials. In some embodiments a TE chip 124 may include a p-type semiconductor portion 130 and an n-type semiconductor portion 132. The p-type and n-type semiconductor portions 130 and 132 may be formed between opposing electrical insulators 134 and opposing electrical conductors 136. The electrical insulator 134 may have a good thermal conducting property but a poor electrical conducting property. The n-type semiconductor portion 132 may have excessive electrons while the p-type semiconductor portion 130 may have insufficient electrons. When DC power is applied between the electrical conductors 136, electrons may move from the electrical conductors 136 to the n-type semiconductor portion 132. Therefore, heat energy may transfer via electrons flowing through the n-type semiconductor portion 132 and the electrical conductors 136. Further, electrons may then change to a low energy state and be released as heat energy. The heat can be then transferred to the abrasive slurry S through the heat-transferring portion 122 and the conduit 111. When materials having p-type and n-type characteristics are connected in series and DC power is applied to the materials, a temperature differential may occur between a side facing the heat exchanger 126 and a side facing the heat transferring portion 122. The TE chip 120 therefore may serve as an electric heat pump to transfer heat from abrasive slurry S to the heat exchanger 126 through the conduit 111 and the heat-transferring portion 122.

Figure 6A:
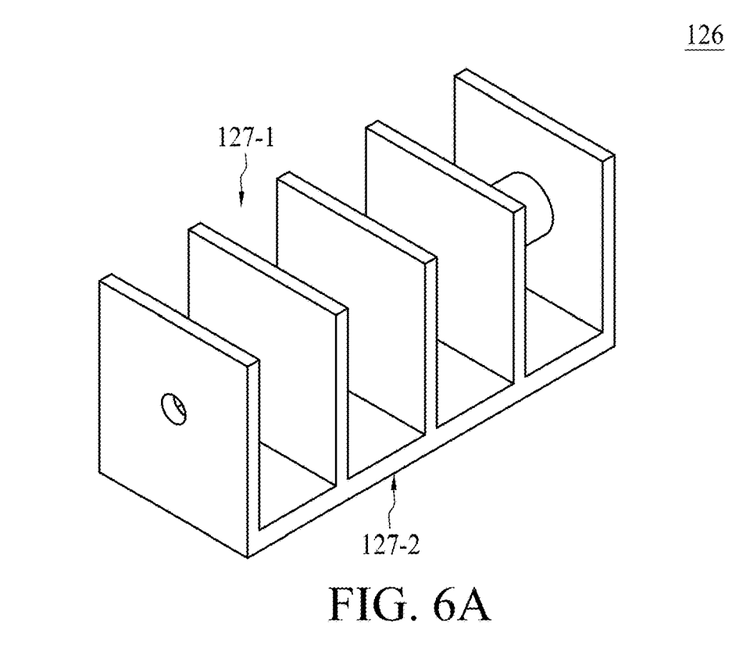
FIGS. 6A and 6B are schematic drawings illustrating a heat exchanger according to aspects of one or more embodiments of the present disclosure.
Figure 6B:
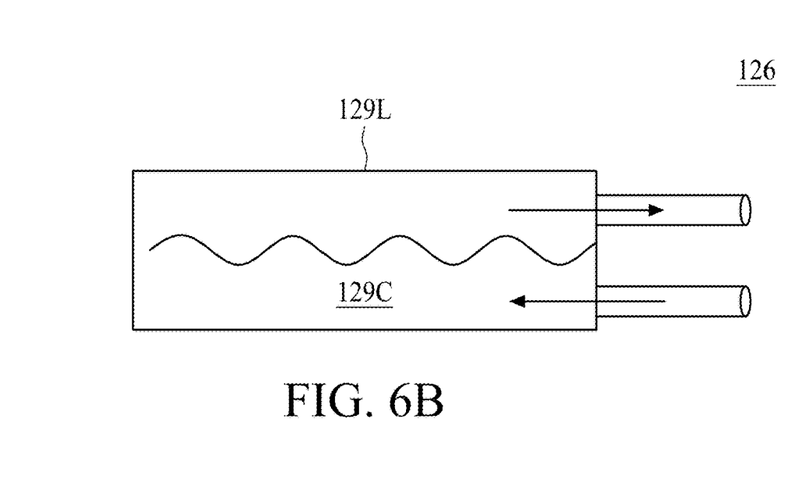

The heat exchanger 126 of the slurry temperature control device 120 is coupled to the TE chip 124. In some embodiments, the heat exchanger 126 includes a dry-type heat exchanger. For example, the heat exchanger 126 can include a plurality of heat sinks, as shown in FIG. 6A. The plurality of heat sinks 127-1 can be coupled to the TE chip 124 through a base 127-2. The plurality of heat sinks 127-1 can extend outwardly from the base 127-2 and helps heat dissipation. In some embodiments, the heat sinks 127-1 form a crown configuration, but the disclosure is not limited thereto. In some embodiments, the heat exchanger 126 includes a wet-type heat exchanger, as shown in FIG. 6B. In such embodiments, the wet-type heat exchanger includes cooling fluid or cooling gas 129C. Further, the slurry temperature control device 120 can further include a loop 129L capable of circulating the cooling fluid or cooling gas 129C. In some embodiments, the loop 129L of the wet-type heat exchange can have a crown-configuration, thus heat dissipation can be further improved.

Additionally, in some embodiments, the conduit 111 of the slurry dispenser 110 can include thermally-conductive material such that heat transfer between the TE chip 124 and the abrasive slurry S can be further improved.

Referring back to FIG. 2, in some embodiments, a cooling liquid or a cooling gas 109C can be provided to the platen 102. In such embodiments, the platen 102 further includes a loop 109L capable of circulating the cooling fluid or cooling gas 109C.

Figure 7:
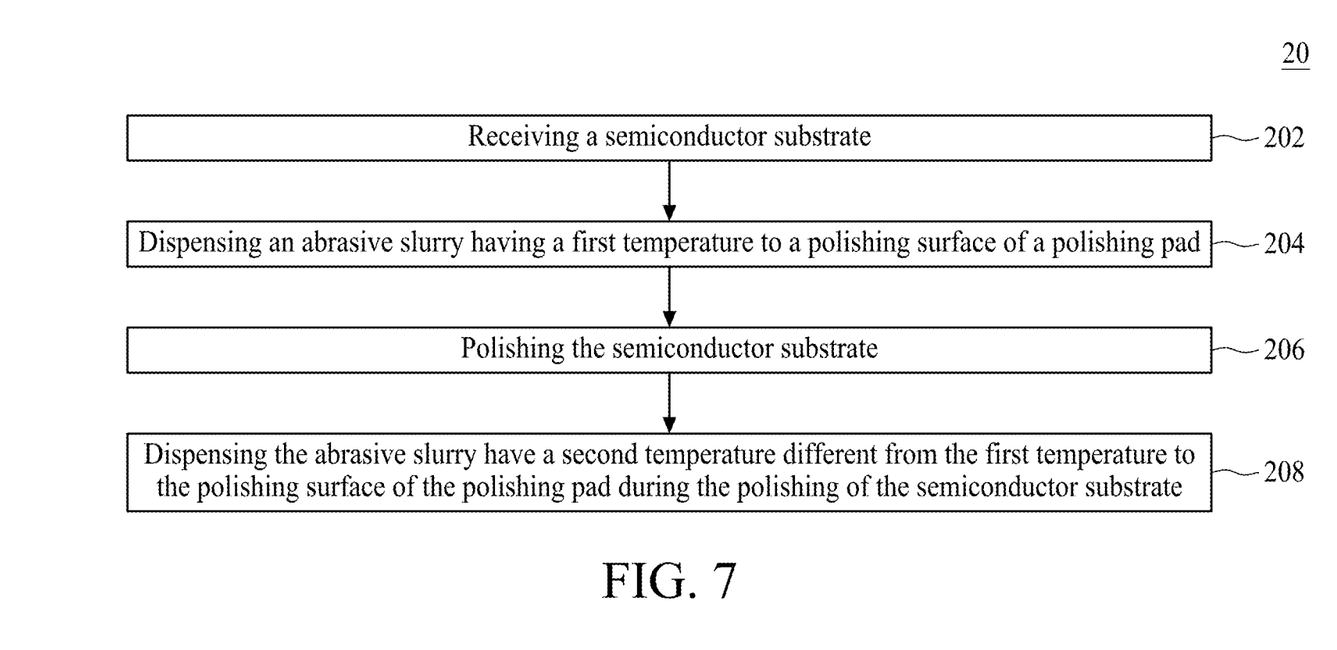
FIG. 7 is a flowchart representing a method for CMP according to aspects of the present disclosure.

FIG. 7 is a flowchart representing a method for a CMP 20. The method for the CMP 20 includes a number of operations (202, 204, 206 and 208). The method for the CMP 20 will be further described according to one or more embodiments. It should be noted that the operations of the method for the CMP 20 may be rearranged or otherwise modified within the scope of the various aspects. It should further be noted that additional processes may be provided before, during, and after the method 20, and that some other processes may only be briefly described herein. Thus other implementations are possible within the scope of the various aspects described herein.

Figure 8:
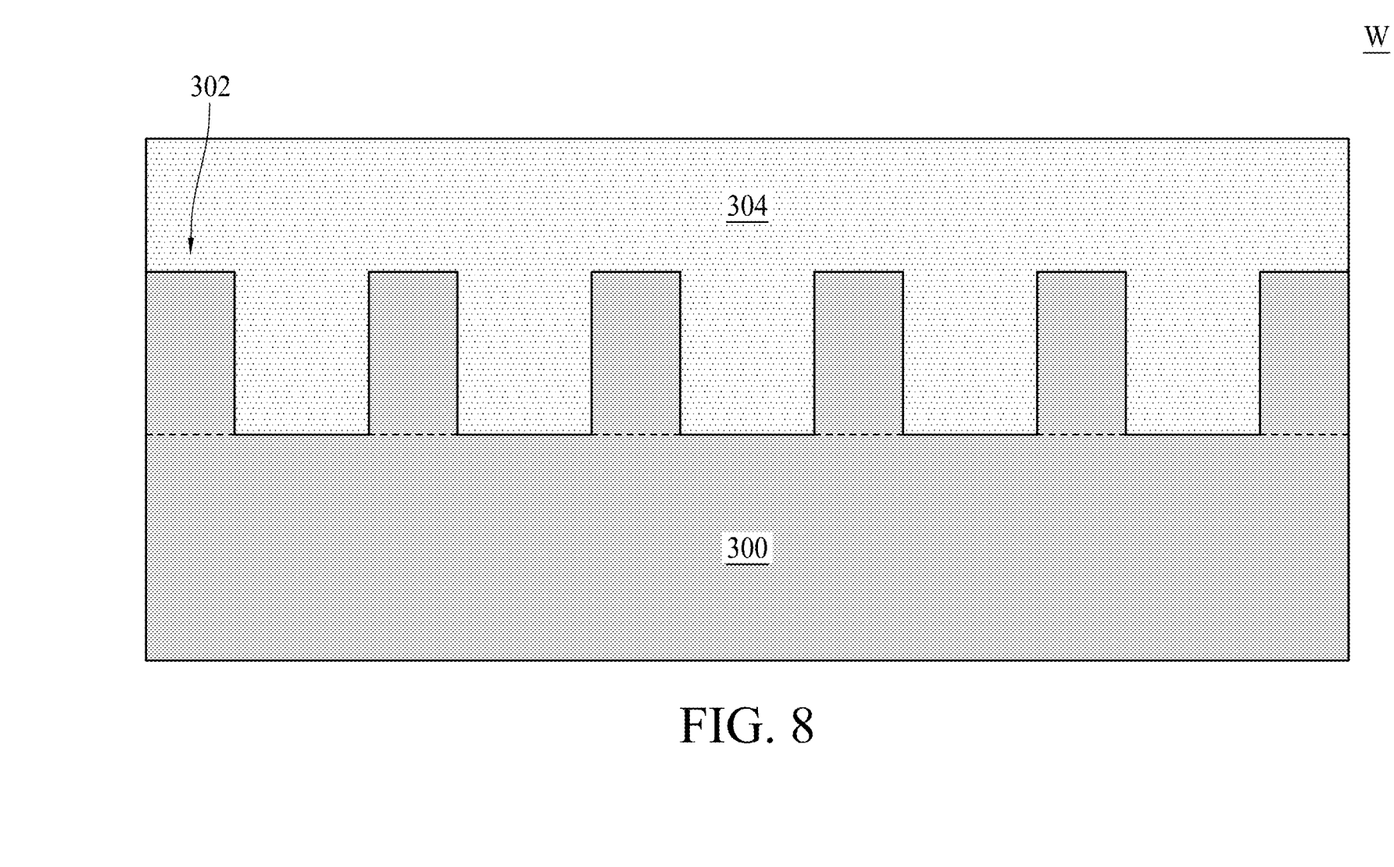
FIGS. 8 to 10 are schematic drawings illustrating a semiconductor substrate at various stages in CMP operation.

At operation 202, a semiconductor substrate 300 is received in an apparatus for CMP. In some embodiments, the apparatus for CMP 100a or 100b can be used in the method 20, but the disclosure is not limited thereto. Further, the semiconductor wafer W depicted in FIGS. 1 and 2 can be referred to as the semiconductor substrate 300. Referring to FIG. 8, in some embodiments, the semiconductor substrate 300 may include a feature 302 formed thereon and a layer 304 covering the feature 302. The feature 302 and the layer 304 can include different materials. The feature 302 can include semiconductor materials, insulating materials or conductive materials. In some embodiments, the feature 302 can be a polysilicon gate feature formed over the semiconductor substrate 300, and the layer 304 can be a dielectric layer covering the polysilicon gate feature. In some embodiments, the feature 302 can be a polysilicon fin feature formed over semiconductor substrate W, and the layer 304 can be a dielectric layer covering the polysilicon fin feature. In some embodiments, an insulating layer can be formed over the semiconductor substrate 300, and a plurality of trenches and/or vias can be formed in the insulating layer and thus an insulating feature 302 can be obtained as shown in FIG. 8. In such embodiments, a conductive layer 304 can be formed to fill the trenches and vias and to cover the insulating feature 302.

At operation 204, an abrasive slurry S having a first temperature is dispensed to the polishing surface 104s of the polishing pad 104. It should be understood that the CMP operation involves both chemical reaction and mechanical force. Further, the chemical reaction efficiency is correlated to the reaction temperature. Usually, the reaction efficiency can be improved by increasing the reaction temperature. In some embodiments, to increase the reaction efficiency of the chemical reaction of the CMP operation, the abrasive slurry S can be heated by the slurry temperature control device 120. In some alternative embodiments, to reduce the reaction efficiency of the chemical reaction of the CMP operation, the abrasive slurry S can be cooled by the slurry temperature control device 120.

Figure 10:
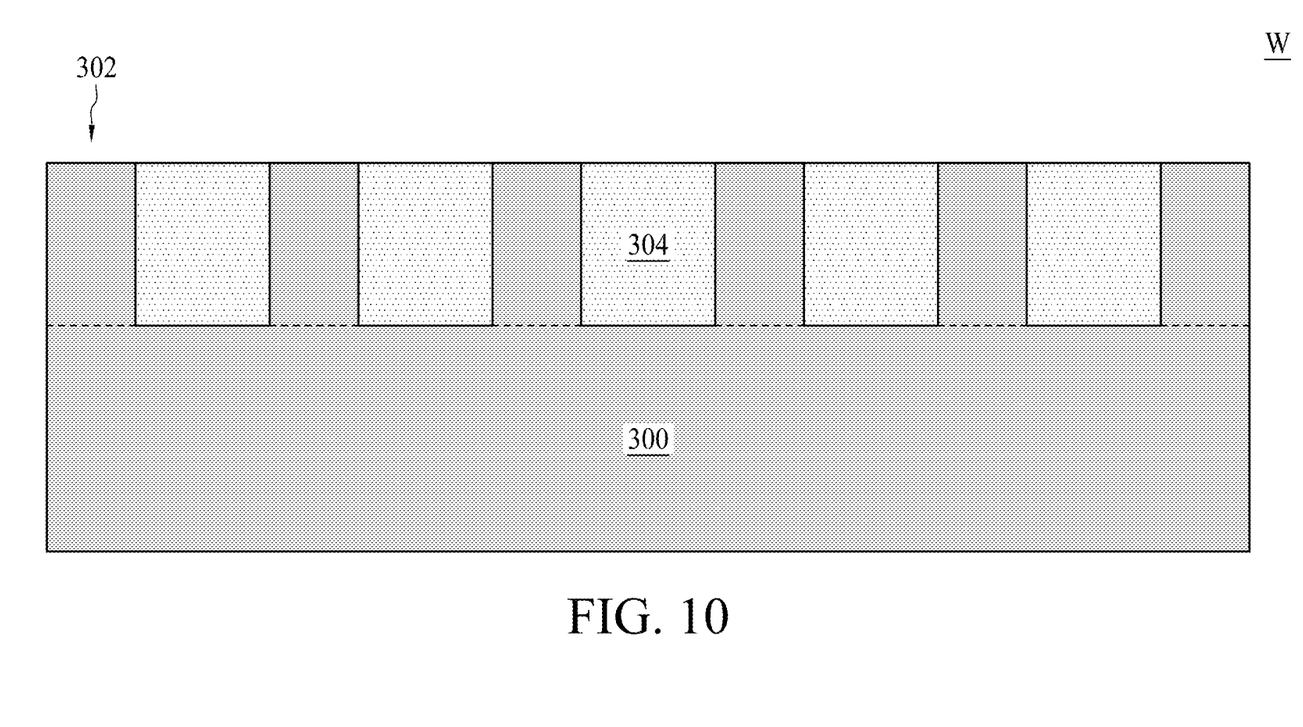

Referring to FIG. 10, in some embodiments, the first temperature of the abrasive slurry S can be raised to greater than approximately 50° C., and the abrasive slurry S having the first temperature greater than approximately 50° C. is dispensed to the polishing surface 104s of the polishing pad 104 at operation 204.

At operation 206, the semiconductor substrate W is polished. During the polishing of the semiconductor substrate W, the semiconductor wafer W is held inside the wafer carrier 106 with upward suction applied to the wafer's backside. The platen 102 is rotated, and the polishing pad 104 is correspondingly rotated. The abrasive slurry S is dispensed onto the polishing surface 104s. The wafer carrier 106 is then rotated and lowered toward the polishing pad 104. When the rotation of the wafer carrier 106 reaches a wafer-polishing speed, the semiconductor wafer W is pressed to contact the polishing surface 104s. This dual rotation, along with the downward force applied to the semiconductor wafer S and the abrasive slurry S, causes the semiconductor wafer W to be gradually planarized. Accordingly, the abrasive slurry S having the first temperature and the downward force together remove a portion of the layer 302 from the semiconductor substrate 300.

In some embodiments, the temperature sensor 112 can be used to detect and monitor the temperature of the abrasive slurry S over the polishing pad 104. In some embodiments, the temperature sensor 112 provides a signal corresponding to the temperature of the abrasive slurry S on the polishing surface 104s to the control module 114, and the control module 114 send signals to the TE chip 124 of the slurry temperature control device 120. If the temperature of the abrasive slurry S is raised to a temperature higher than the target value during the CMP operation, the control module 114 can send signals to the TE chip 124, and the temperature of the abrasive slurry S can be reduced by the TE chip 124. Accordingly, the slurry temperature control device 120 provides an immediate temperature control to the abrasive slurry S.

Figure 9:
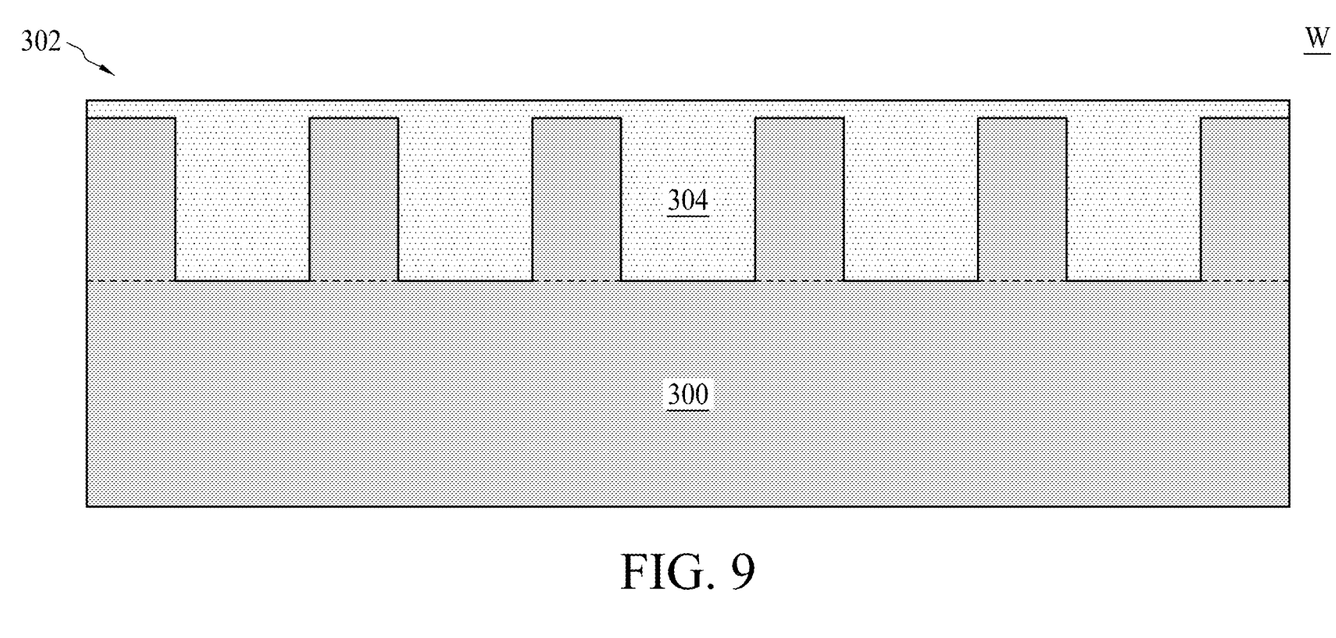
Figure 11:
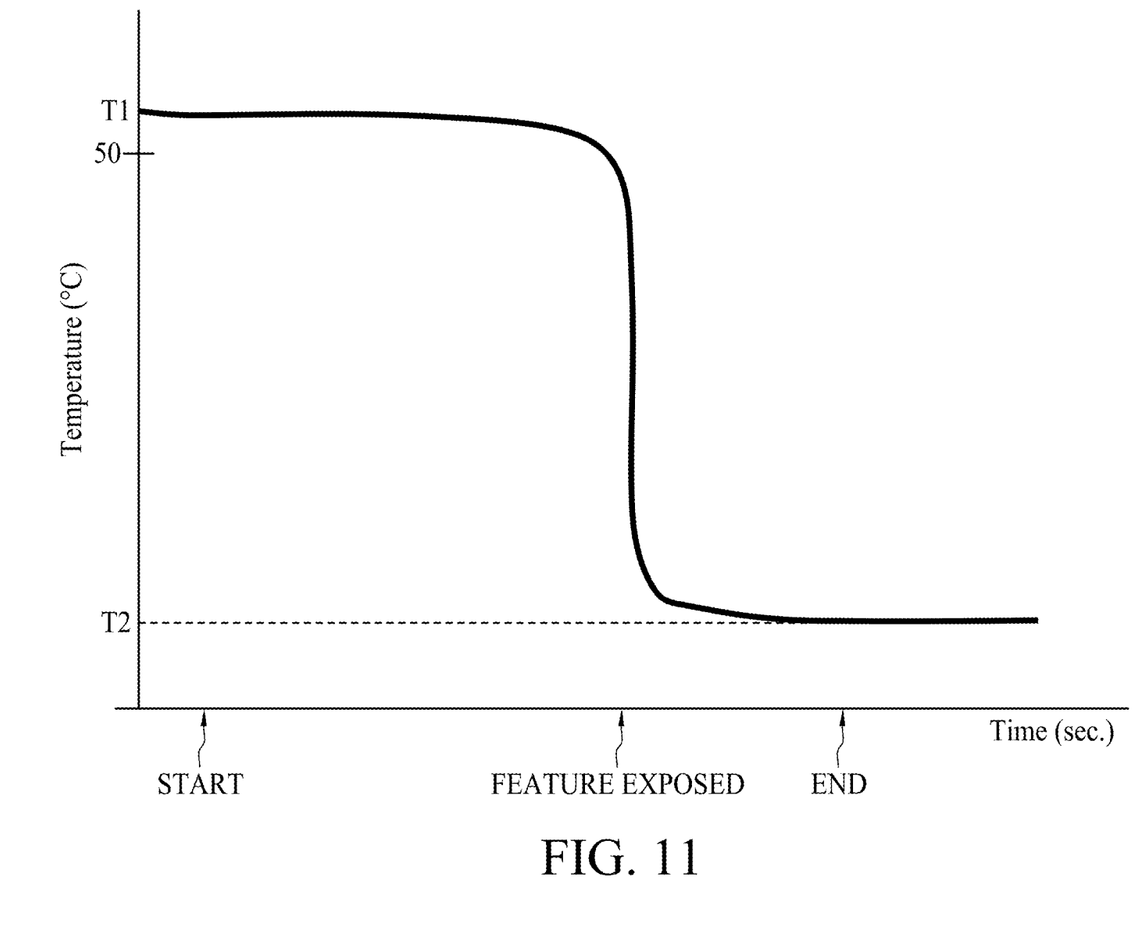
FIG. 11 is a graph illustrating a relation between temperature of a wafer and time.

Referring to FIG. 9, in some embodiments, operation 204 and operation 206 can be performed when the portion of the layer 304 is removed to almost expose the feature 302. In some embodiments, at operation 208, the abrasive slurry S having a second temperature is dispensed to the polishing surface 104s of the polishing pad 104 during the polishing of the semiconductor substrate 300. In some embodiments, the dispensing of the abrasive slurry S having the second temperature is performed in response to an operation time. For example, an operation time for removing the portion of the layer 304 before exposing the feature 302 can be estimated, as shown in FIG. 11. In such embodiments, the dispensing of the abrasive slurry S having the second temperature is performed at the end of the estimated operation time.

In other embodiments, operation 206 can be performed after the feature 302 is exposed. In such embodiments, the dispensing of the abrasive slurry S having the second temperature is performed in response to a vibration signal. It should be understood that a polishing force and polishing torque are changed due to the different frictions between an original material layer and a newly exposed material layer. Accordingly, a vibration of the wafer carrier 106 or a vibration of the polishing pad 104 may be changed due to the different frictions. Consequently, when such change is detected, a vibrate signal may be sent to the control module 114, and the control module 114 may instruct the slurry temperature control device 120 to adjust the temperature of the abrasive slurry S.

At operation 208, the abrasive slurry S having the second temperature is dispensed to the polishing surface 104s of the polishing pad 104. As mentioned above, the chemical reaction efficiency is correlated to the reaction temperature. Usually, the reaction efficiency can be reduced by reducing the reaction temperature. In some embodiments, to increase the reaction efficiency of the chemical reaction of the CMP operation, the abrasive slurry can be heated by the slurry temperature control device 120. In some alternative embodiments, to reduce the reaction efficiency of the chemical reaction of the CMP operation, the abrasive slurry can be cooled by the slurry temperature control device 120. Referring to FIG. 10, in some embodiments, the second temperature T2 of the abrasive slurry S can be reduced to less than approximately 25° C., and the abrasive slurry S having the second temperature T2 less than approximately 25° C. is dispensed at operation 204.

At operation 208, the abrasive slurry S having the second temperature is dispensed to the polishing surface 104s of the polishing pad 104 during the polishing of the semiconductor substrate 300. Accordingly, the abrasive slurry S having the second temperature and the downward force from the wafer carrier 106 may together remove a portion of the layer 302 and a portion of the feature 302 from the semiconductor substrate 300, as shown in FIG. 10.

In some embodiments, the temperature sensor 112 can be used to detect and monitor the temperature of the abrasive slurry S over the polishing pad 104, and to provide a signal corresponding to the temperature of the polishing surface 104s to the control module 114. If the temperature of the abrasive slurry S is raised to a temperature higher or lower than the target value during the CMP operation, the control module 114 can send signals to the TE chip 124, and the second temperature of the abrasive slurry S can be reduced or increased by the TE chip 124. Accordingly, the slurry temperature control device 120 provides an immediate temperature control to the abrasive slurry S.

In some embodiments, the second temperature of the abrasive slurry S is less than the first temperature of the abrasive slurry S. At operation 204, the goal of the CMP operation is to remove the superfluous material as soon as possible. Therefore the first temperature of the abrasive slurry S can be raised to a temperature greater than approximately 50° C., such that the chemical reaction efficiency is accelerated. Consequently, the layer 304 overlapping the feature 302 can be removed with greater efficiency. However, once the feature 302 is exposed, the focus of the CMP operation changes to obtaining a surface that is as uniform as possible. Therefore, the second temperature of the abrasive slurry S can be reduced to a temperature less than 25° C. It is found that such reduction in temperature improves the uniformity achieved by the polishing of the semiconductor substrate 300.

The present disclosure therefore provides a CMP device having a slurry temperature control device for a slurry dispenser and for an abrasive slurry. In some embodiments, the slurry temperature control device includes a TE chip that is capable of providing precise and immediate cooling or heating depending on the supplied voltage output. The abrasive slurry is essential to the CMP operation and is disposed between a polishing surface of the polishing pad and a wafer surface. The cooled or heated abrasive slurry is directly used in the wafer polishing. Therefore, the slurry temperature control device is provided for instant abrasive slurry cooling and heating control, and thus temperature control of the polishing operation is improved.

In some embodiments, a method for polishing a semiconductor substrate is provided. The method includes the following operations. A semiconductor substrate is received. An abrasive slurry having a first temperature is dispensed to a polishing surface of a polishing pad. The semiconductor substrate is polished. The abrasive slurry have a second temperature is dispensed to the polishing surface of the polishing pad during the polishing of the semiconductor substrate. In some embodiments, the second temperature is different from the first temperature.

In some embodiments, a method for polishing a substrate is provided. The method includes the following operations. A substrate is received. The substrate includes a feature and a layer covering the feature. The feature and the layer include different materials. An abrasive slurry is heated to a first temperature. The abrasive slurry having the first temperature is dispensed to a polishing surface of a polishing pad. A surface of the layer is polished. The abrasive slurry is cooled to a second temperature. The abrasive slurry having the second temperature is dispensed to the polishing surface of the polishing pad at an end of the polishing of the substrate.

In some embodiments, a method for polishing a substrate is provided. The method includes the following operations. A substrate is received. The substrate includes a feature and a layer covering the feature. The feature and the layer include different materials. An abrasive slurry is heated to a first temperature by a slurry temperature control device. A portion of the layer is removed by a polishing using the abrasive slurry having the first temperature. The abrasive slurry is cooled to a second temperature by the slurry temperature control device. A portion of the layer and a portion of the feature are removed by the polishing using the abrasive slurry having the second temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for polishing a semiconductor substrate, comprising:
   receiving a semiconductor substrate;
   dispensing an abrasive slurry having a first temperature to a polishing surface of a polishing pad;
   polishing the semiconductor substrate;
   cooling the abrasive slurry to a second temperature lower than the first temperature; and
   dispensing the abrasive slurry having the second temperature to the polishing surface of the polishing pad during the polishing of the semiconductor substrate.

2. The method of claim 1, wherein the cooling of the abrasive slurry to the second temperature is performed by a slurry temperature control device.

3. The method of claim 1, wherein the semiconductor substrate comprises a feature and a layer covering the feature, and the feature and the layer comprise different materials.

4. The method of claim 3, wherein the dispensing of the abrasive slurry having the first temperature and the dispensing of the abrasive slurry having the second temperature further comprise:
   dispensing the abrasive slurry having the first temperature to remove a portion of the layer; and
   dispensing the abrasive slurry having the second temperature to remove a portion of the layer and a portion of the feature.

5. The method of claim 4, wherein the dispensing of the abrasive slurry having the second temperature is performed in response to an operation time or a vibration signal.

6. A method for polishing a substrate, comprising:
   receiving a substrate comprising a feature and a layer covering the feature, wherein the feature and the layer comprise different materials;
   heating an abrasive slurry to a first temperature;
   dispensing the abrasive slurry having the first temperature to a polishing surface of a polishing pad;
   polishing a surface of the layer;
   cooling the abrasive slurry to a second temperature; and
   dispensing the abrasive slurry having the second temperature to the polishing surface of the polishing pad at an end of the polishing of the substrate.

7. The method of claim 6, wherein the feature comprises a semiconductor feature, and the layer comprises a dielectric layer.

8. The method of claim 7, wherein the semiconductor feature comprises a gate feature or a fin feature.

9. The method of claim 6, wherein the feature comprises a dielectric feature, and the layer comprises a conductive layer.

10. The method of claim 6, wherein the first temperature is greater than 50° C.

11. The method of claim 6, wherein the second temperature is less than 25° C.

12. The method of claim 6, further comprising heating the abrasive slurry to the first temperature and cooling the abrasive slurry to the second temperature by a slurry temperature control device.

13. The method of claim 6, wherein the dispensing of the abrasive slurry having the first temperature and the dispensing of the abrasive slurry having the second temperature further comprise:
dispensing the abrasive slurry having the first temperature to remove a portion of the layer; and
dispensing the abrasive slurry having the second temperature to remove a portion of the layer and a portion of the feature.

14. The method of claim 6, wherein the surface of the layer and a surface of the feature are aligned with each other at the end of the polishing of the semiconductor substrate.

15. A method for polishing a substrate, comprising:
receiving a substrate comprising a feature and a layer covering the feature, wherein the feature and the layer comprise different materials;
heating an abrasive slurry to a first temperature by a slurry temperature control device;
removing a portion of the layer by a polishing using the abrasive slurry having the first temperature;
cooling the abrasive slurry to a second temperature by the slurry temperature control device; and
removing a portion of the layer and a portion of the feature by the polishing using the abrasive slurry having the second temperature.

16. The method of claim 15, wherein the feature comprises a semiconductor feature, and the layer comprises a dielectric layer.

17. The method of claim 16, wherein the semiconductor feature comprises a gate feature or a fin feature.

18. The method of claim 15, wherein the feature comprises a dielectric feature, and the layer comprises a conductive layer.

19. The method of claim 15, wherein the first temperature is greater than 50° C., and the second temperature is less than 25° C.

20. The method of claim 15, wherein the dispensing of the abrasive slurry having the second temperature is performed in response to an operation time or a vibration signal.

* * * * *